(12) United States Patent
Yan et al.

(10) Patent No.: US 11,973,030 B2
(45) Date of Patent: Apr. 30, 2024

(54) LAYOUT STRUCTURE OF eFUSE UNIT

(71) Applicant: Shanghai Huali Microelectronics Corporation, Shanghai (CN)

(72) Inventors: Ying Yan, Shanghai (CN); Jianming Jin, Shanghai (CN)

(73) Assignee: Shanghai Huali Microelectronics Corporation, Shanghai (CN)

(*) Notice: Subject to any disclaimer, the term of this patent is extended or adjusted under 35 U.S.C. 154(b) by 191 days.

(21) Appl. No.: 16/952,288

(22) Filed: Nov. 19, 2020

(65) Prior Publication Data

US 2022/0059457 A1 Feb. 24, 2022

(30) Foreign Application Priority Data

Aug. 18, 2020 (CN) .......................... 202010832321.3

(51) Int. Cl.
*H01L 23/525* (2006.01)
(52) U.S. Cl.
CPC ................................. *H01L 23/5256* (2013.01)
(58) Field of Classification Search
CPC ......... H01L 23/62; H01L 23/525–5258; H01L 27/1026; H01L 27/11206; H01L 2924/1456; G11C 17/14–146
See application file for complete search history.

(56) References Cited

U.S. PATENT DOCUMENTS

| 2015/0067620 | A1* | 3/2015 | Wu | G06F 30/30 716/53 |
| 2020/0126911 | A1* | 4/2020 | Li | H01H 69/022 |
| 2021/0104460 | A1* | 4/2021 | Allman | H01L 23/5283 |

* cited by examiner

*Primary Examiner* — Laura M Menz
*Assistant Examiner* — Candice Chan
(74) *Attorney, Agent, or Firm* — Banner & Witcoff, Ltd.

(57) ABSTRACT

The disclosure discloses a layout structure of an eFuse unit, comprising pad, link, and shield, wherein: a pad is respectively disposed on both ends of the link in a length direction; the shield and the link are at the same metal layer; the shield comprises a plurality of independent metal wires; the plurality of independent metal wires are arranged on both sides of the link; the length of each independent metal wire is greater than the width thereof; and a length direction of each independent metal wire is perpendicular to the length direction of the link. The disclosure not only forms a barrier protection layer for preventing burst metal spraying from affecting other circuits, but also can prevent spayed metal from reflecting back and connecting to a broken link, so as to improve the programming reliability of the eFuse unit.

8 Claims, 2 Drawing Sheets

LAYOUT STRUCTURE OF eFUSE UNIT

CROSS-REFERENCES TO RELATED APPLICATIONS

This application claims priority to Chinese Patent Application No. 202010832321.3, filed on Aug. 18, 2020, and entitled "Layout Structure of Efuse Unit", the disclosure of which is incorporated herein by reference in its entirety.

TECHNICAL FIELD

The disclosure relates to integrated circuit layout technologies, in particular to a layout structure of an eFuse (electrically programmable fuse) unit.

BACKGROUND

The eFuse is a one-time programmable (OTP) device. The fusing of the fuse is implemented based on the electromigration principle and is converted into a logic output to implement an on-chip programming function; and the reliability of a programming operation thereof is the most main indicator.

There are many ways to improve the reliability of an eFuse unit, wherein the mode of disposing a shield on the layout of the eFuse unit is a common means. Such the mode can prevent the fuse from spraying metal to other circuits during bursting which causes functional disablement of the eFuse unit.

Two conventional layout structures of the eFuse unit are shown in FIG. 1 and FIG. 2, having the feature that the entire fuse is composed of a pad portion, a link, and a shield. A pad is respectively disposed at both ends of the link, and the pad adopts a metal layer the same as that of the link. The pad has a relatively large area and has a large effective heat dissipation area, such that the fusing of the eFuse unit occurs on a middle portion of the link, rather than at the two ends of the link, because the relatively large pad area can facilitate the heat dissipation. Moreover, during electromigration, the link accumulates heat, and a temperature gradient from high temperature to low temperature is formed on the link, causing the fusing process to occur at a high temperature portion on the middle portion of the link. However, in actual programming, if the heat accumulation on the link is excessively fast and in an excessively large amount, a phenomenon of link bursting occurs, and the fuse metal may be sprayed. Therefore, a shield is designed in the conventional layout of the eFuse unit to block the metal sprayed by the bursting and thereby prevent the metal from affecting other circuits. The shield is composed of a single or a plurality of metal wires at same layer parallel to the link, and is used to prevent a substance on the burst metal wire from affecting other modules which causes functional disablement. However, although the conventional shield layout mode can achieve a blocking effect, the sprayed metal may be reflected back to the link after hitting the shield parallel to the link, resulting in the reconnection of the broken link, in this case, the resistance of the broken link changes from a larger value to a smaller value, causing an error in a logic output and thereby causing a programming operation to fail.

BRIEF SUMMARY

The technical problem solved by the disclosure is providing a layout structure of an eFuse unit, not only forming a block protection layer for preventing burst metal spraying from affecting other circuits, but also preventing spayed metal from reflecting back and connecting to a broken link, so as to improve the programming reliability of the eFuse unit.

In order to solve the above technical problem, the layout structure of an eFuse unit provided by the disclosure comprises pad, link, and shield, wherein:
  a pad is respectively disposed on both ends of the link in a length direction;
  the shield and the link are at the same metal layer;
  the shield comprises a plurality of independent metal wires;
  the plurality of independent metal wires are arranged on both sides of the link and arranged between the pads at both ends of the link;
  the length of each independent metal wire is greater than the width thereof; and
  a length direction of each independent metal wire is perpendicular to the length direction of the link.

In an example, minimum distances from each independent metal wires at the same side of the link to the link are same.

In an example, intervals between the adjacent independent metal wires at the same side of the link are same.

In an example, the width of each metal wire of the shield is the same as the width of the link.

In an example, the lengths of all the metal wires of the shield are same.

In an example, an interval d between the adjacent independent metal wires at the same side of the link is $1/7$-$1/5$ of the length b of the link.

In an example, an interval d between the adjacent independent metal wires at the same side of the link is $1/6$ of the length b of the link.

In an example, a minimum distance c from the independent metal wire to the link is 1.5-2.5 times of the width a of the link.

In an example, a minimum distance c from the independent metal wire to the link is 2 times of the width a of the link.

In the layout structure of an eFuse unit provided by the disclosure, a shield portion thereof adopts a layout form perpendicular to the direction of the link, and two rows of uniformly-spaced independent metal wires which are perpendicular to the link are separately arranged at two sides of the link, not only forming a barrier protection layer for preventing burst metal spraying from affecting other circuits, but also preventing spayed metal from reflecting back and connecting to a broken link and thereby causing a programming failure of the eFuse unit, so as to improve the programming reliability of the eFuse unit.

BRIEF DESCRIPTION OF THE DRAWINGS

In order to more clearly explain the technical solution of the present application or, the drawings required in the present application will be briefly described below. It is obvious that the drawings described below are merely some embodiments of the present application, and those skilled in the art could also obtain other drawings on the basis of these drawings without contributing any inventive labor.

DETAILED DESCRIPTION OF THE DISCLOSURE

The technical solution of the disclosure will be clearly and completely described below with reference to the drawings. Obviously, the described embodiments are part of the embodiments of the disclosure, instead of all of them. Based on the embodiments in the disclosure, all other embodiments obtained by those skilled in the art without contributing any inventive labor shall fall into the protection scope of the disclosure.

Embodiment 1

Figure 1:
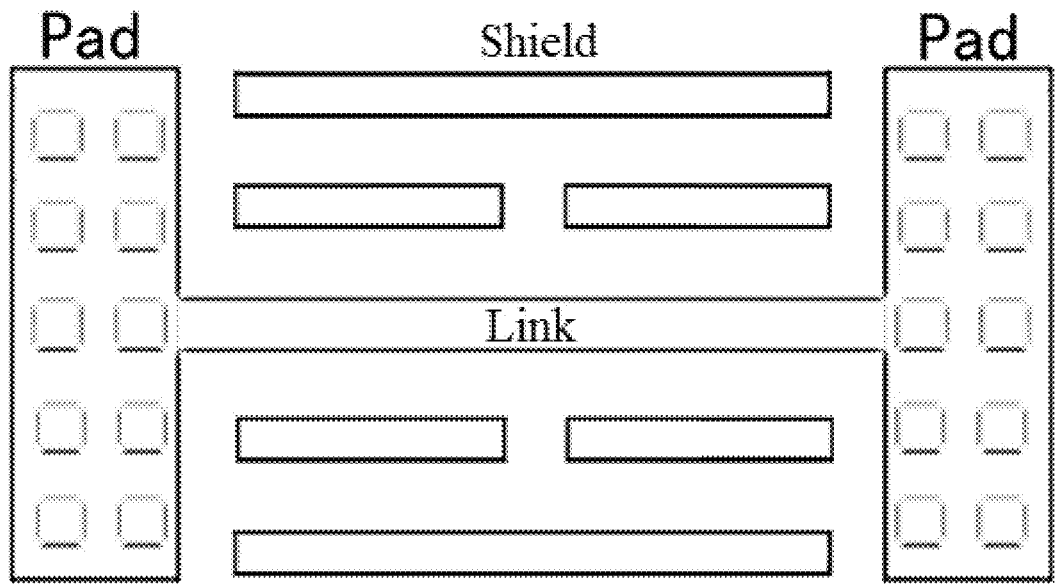
FIG. 1 is a conventional layout structure of an eFuse unit.
Figure 2:
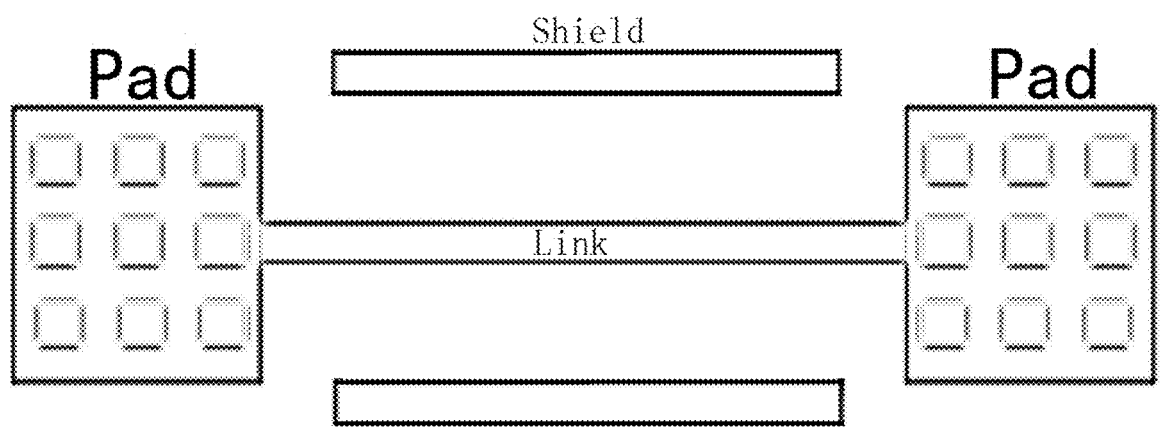
FIG. 2 is another conventional layout structure of an eFuse unit.
Figure 3:
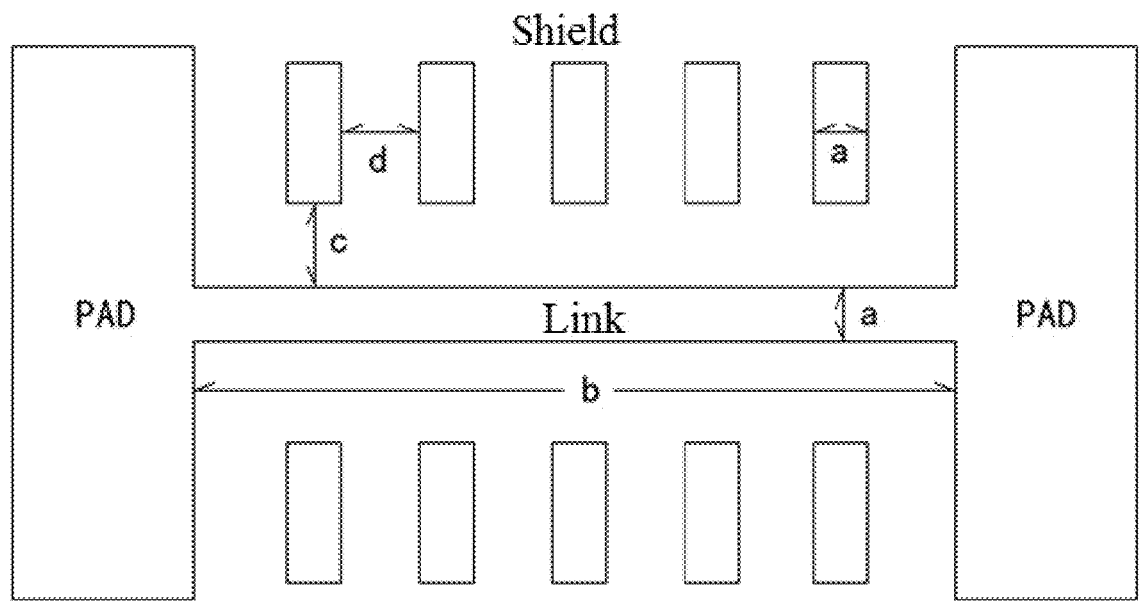
FIG. 3 is a schematic structural diagram of a layout structure of an eFuse unit according to an embodiment of the disclosure.

Referring to FIG. 3, a layout structure of an eFuse unit includes pad, link, and shield.

A pad is respectively disposed on both ends of the link in a length direction.

The shield and the link are at the same metal layer.

The shield includes a plurality of independent metal wires.

The plurality of independent metal wires are arranged on both sides of the link and arranged between the pads at both ends of the link.

The length of each independent metal wire is greater than the width thereof.

A length direction of each independent metal wire is perpendicular to the length direction of the link.

Figure 4:
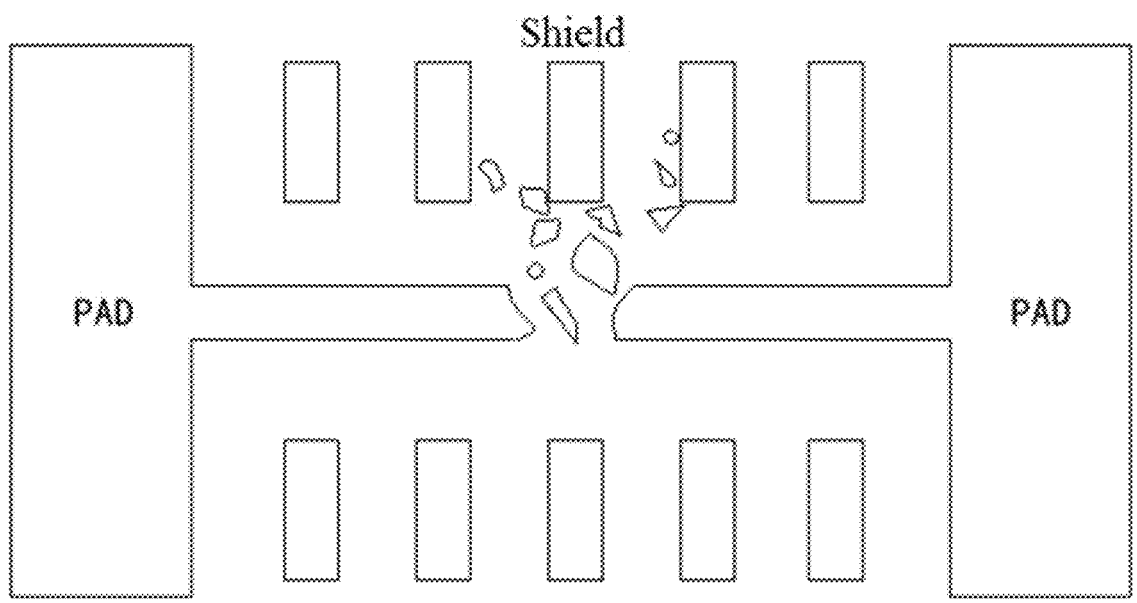
FIG. 4 is a block effect diagram of a shield of the layout structure of an eFuse unit according to an embodiment of the disclosure.

In the layout structure of an eFuse unit of embodiment 1, a shield portion thereof adopts a layout form perpendicular to the direction of the link, and two rows of uniformly-spaced independent metal wires which are perpendicular to the link are separately arranged at two sides of the link, not only forming a barrier protection layer for preventing burst metal spraying from affecting other circuits, but also preventing spayed metal from reflecting back and connecting to a broken link (referring to FIG. 4) and thereby causing a programming failure of the eFuse unit, so as to improve the programming reliability of the eFuse unit.

Embodiment 2

In the layout structure of an eFuse unit of embodiment 1, minimum distances from the independent metal wires at the same side of the link to the link are same.

In an example, a minimum distance c from the independent metal wire to the link is 1.5-2.5 times (e.g., 2 times) of the width a of the link.

Embodiment 3

In the layout structure of an eFuse unit of embodiment 1, intervals between the adjacent independent metal wires at the same side of the link are same.

In an example, an interval d between the adjacent independent metal wires at the same side of the link is $1/7$-$1/5$ (e.g., $1/6$) of the length b of the link.

Embodiment 4

In the layout structure of an eFuse unit of embodiment 1, the width of each metal wire of the shield is the same as the width of the link.

In an example, the lengths of all the metal wires of the shield are same.

The above embodiments are merely preferred embodiments of the disclosure and are not intended for limiting the disclosure. Any changes, equivalent replacements, or improvements made within the spirit and principle of the disclosure shall fall within the protection scope of the disclosure.

What is claimed is:

1. A layout structure of an eFuse unit, comprising pads, a link, and a shield, wherein:
   the pads are respectively disposed at both ends of the link in a length direction of the link;
   the shield and the link are at a same metal layer;
   the shield comprises a plurality of independent metal wires;
   the plurality of independent metal wires are arranged on both sides of the link to form two rows, and arranged between the pads respectively disposed at both ends of the link;
   a length of each independent metal wire is greater than a width thereof;
   a length direction of each independent metal wire is perpendicular to the length direction of the link; and
   minimum distances from the independent metal wires at a same side of the link to the link are the same.

2. The layout structure of the eFuse unit according to claim 1, wherein intervals between adjacent independent metal wires at a same side of the link are the same.

3. The layout structure of the eFuse unit according to claim 1, wherein the width of each independent metal wire is the same as a width of the link.

4. The layout structure of the eFuse unit according to claim 1, wherein lengths of all of the plurality of independent metal wires are the same.

5. The layout structure of the eFuse unit according to claim 1, wherein an interval between adjacent independent metal wires at a same side of the link is $1/7$-$1/5$ of a length of the link.

6. The layout structure of the eFuse unit according to claim 1, wherein an interval between adjacent independent metal wires at a same side of the link is $1/6$ of a length of the link.

7. The layout structure of the eFuse unit according to claim 1, wherein a minimum distance from the independent metal wires to the link is 1.5-2.5 times a width of the link.

8. The layout structure of the eFuse unit according to claim 1, wherein a minimum distance from the independent metal wires to the link is 2 times a width of the link.

* * * * *